(12) United States Patent
Nätti

(10) Patent No.: US 9,613,738 B2
(45) Date of Patent: Apr. 4, 2017

(54) MAGNET

(71) Applicant: Ixtur Oy, Piikkio (FI)

(72) Inventor: Reijo Nätti, Littoinen (FI)

(73) Assignee: Ixtur Oy, Piikkiö (FI)

( * ) Notice: Subject to any disclaimer, the term of this patent is extended or adjusted under 35 U.S.C. 154(b) by 0 days.

(21) Appl. No.: 15/115,703

(22) PCT Filed: Jan. 12, 2015

(86) PCT No.: PCT/FI2015/050014
§ 371 (c)(1),
(2) Date: Aug. 1, 2016

(87) PCT Pub. No.: WO2015/114202
PCT Pub. Date: Aug. 6, 2015

(65) Prior Publication Data
US 2017/0011831 A1    Jan. 12, 2017

(30) Foreign Application Priority Data

Jan. 30, 2014 (FI) ..................................... 20145100
Jan. 30, 2014 (FI) ..................................... 20145101
Jan. 30, 2014 (FI) ..................................... 20145103

(51) Int. Cl.
*B66C 1/04* (2006.01)
*H01F 7/02* (2006.01)
(Continued)

(52) U.S. Cl.
CPC .......... *H01F 7/0226* (2013.01); *B25B 11/002* (2013.01); *G01D 5/14* (2013.01); *H01F 7/0257* (2013.01)

(58) Field of Classification Search
CPC ..... B25B 11/002; H01F 7/0252; H01F 7/0257
(Continued)

(56) References Cited

U.S. PATENT DOCUMENTS 2,915,682 A   12/1959  Bower
2,947,921 A    8/1960  Watelet
(Continued)

FOREIGN PATENT DOCUMENTS

DE   3029720 C1   8/1982
DE   19951703 A   5/2001
(Continued)

OTHER PUBLICATIONS

Finnish Patent and Registration Office Search report of priority application No. 20145100, dated Sep. 29, 2014.
(Continued)

*Primary Examiner* — Ramon M Barrera
(74) *Attorney, Agent, or Firm* — Berggren, Inc.

(57)    ABSTRACT

The present invention relates to a magnet, which comprises a body and a slide arranged to be movable relative to the body between a first and a second position. The slide comprises a permanent magnet, and a cylindrical first pole piece and a second pole piece, which are attached to opposite magnetic pole surfaces of the permanent magnet. The body comprises a first and a second section made of magnetic material and being separated from each other by a third section that is made of non-magnetic material. The first section comprises a cylindrical recess into which the slide is movably arranged so that, at the first position of the slide, the cylindrical first pole piece, the permanent magnet and at least part of the second pole piece are located inside the cylindrical recess, and at the second position of the slide, at least part of the cylindrical first pole piece is located inside the cylindrical recess and the second pole piece is located outside the cylindrical recess.

16 Claims, 6 Drawing Sheets

(51) Int. Cl.
*G01D 5/14* (2006.01)
*B25B 11/00* (2006.01)

(58) Field of Classification Search
USPC ............... 294/65.5; 335/285–295; 269/8
See application file for complete search history.

(56) References Cited

U.S. PATENT DOCUMENTS

| | | | |
|---|---|---|---|
| 3,079,191 A | 2/1963 | Engelsted et al. |
| 3,109,967 A | 11/1963 | Churchill |
| 3,179,858 A | 4/1965 | Binder et al. |
| 3,503,024 A | 3/1970 | Iwasaki |
| 4,121,865 A | 10/1978 | Littwin, Sr. |

FOREIGN PATENT DOCUMENTS

| | | |
|---|---|---|
| EP | 1541255 A1 | 6/2005 |
| EP | 2085349 A1 | 8/2009 |
| GB | 874600 A | 8/1961 |
| JP | 2009039849 A | 2/2009 |
| JP | 2009135411 A | 6/2009 |
| WO | 2012160262 A1 | 11/2012 |

OTHER PUBLICATIONS

Finnish Patent and Registration Office Search report of priority application No. 20145101, dated Sep. 29, 2014.
Finnish Patent and Registration Office Search report of priority application No. 20145103, dated Sep. 30, 2014.
European Patent Office Search report of international applicaiton No. PCT/FI2015/050014, dated Mar. 23, 2015.

MAGNET

PRIORITY

This application is a U.S. national application under 35 U.S.C. section 371 of international application number PCT/FI2015/050014 filed on Jan. 12 2015 and claiming priority of Finnish national application FI20145100, FI20145101, and FI20145103 each of which was filed on Jan. 30 2014. The contents of PCT application PCT/FI2015/050014, and of the national applications FI20145100, FI201450101 and FI20145103 are incorporated herein by reference.

TECHNICAL FIELD OF THE INVENTION

The present invention relates to a magnet according to the preamble of the appended independent claim.

BACKGROUND OF THE INVENTION

Magnets are used in many fields of technology to perform various operations, such as to control motion, to switch electrical circuits and to move objects. A magnet is typically provided with a certain functionality to change its magnetic state. A magnet may comprise, for example, a coil which produces a magnetic field that is dependent on the amount and the direction of the electric current supplied to the coil. The coil may be used alone, or it can be combined with a permanent magnet, whereby the coil is used to increase or decrease the magnetic field produced by the permanent magnet. Alternatively, a magnet may comprise a movable part, the position of which determines the magnetic state of the magnet. The movable part, which comprises a permanent magnet, is moved relative to a body of the magnet, for example, with a magnetic force produced by a coil that is arranged to encircle the movable part.

An example of a magnet that comprises a movable part for changing the magnetic state of the magnet is disclosed in the document WO 2012/160262. The magnet of the document WO 2012/160262 is a so-called bi-stable magnet, wherein the movable part, which comprises a permanent magnet, is arranged to be movable relative to a body of the magnet between two positions. In the first position, the movable part is in contact with the body, whereby the magnetic flux generated by the permanent magnet may be directed through the body to an object to be attached.

In the second position, the movable part is separated from the body so that the flow of the magnetic flux in the body is significantly reduced and thus the holding force of the magnet is negligible. The body of the magnet comprises a coil that is arranged around the movable part. The movable part is moved between the two positions by supplying a sufficient amount of electric current through the coil in a suitable direction.

A problem associated with the magnet of the document WO 2012/160262 relates to the second position of the movable part, i.e. to the position, wherein the movable part is not in contact with the body. In order to make sure that the movable part stays in its second position, either electric current must constantly be supplied to the coil, or the magnet must be provided with springs or other suitable means to push the movable part towards the second position. In the first case, a disadvantage is the power consumption of the coil, whereas in the second case, a disadvantage is the complicated structure, which may easily be damaged, thus resulting in a malfunction of the magnet.

OBJECTIVES OF THE INVENTION

It is the main objective of the present invention to reduce or even eliminate prior art problems presented above.

It is an objective of the present invention to provide a magnet that has stable magnetic states at which the magnet does not consume energy. It is also an objective of the invention to provide a magnet, whose magnetic state can be changed easily using very little energy.

It is a further objective of the invention to provide a magnet having a structure that enables to achieve a large holding force with a small size. It is still a further objective of the invention to provide a magnet that has a simple structure, low manufacturing costs, a long life expectancy and a great reliability.

In order to realise the above-mentioned objectives, the magnet according to the invention is characterised by what is presented in the characterising part of the appended independent claim. Advantageous embodiments of the invention are described in the dependent claims.

DESCRIPTION OF THE INVENTION

A typical magnet according to the invention comprises a body and a slide arranged to be movable relative to the body between a first and a second position, the slide comprising a permanent magnet, a cylindrical first pole piece and a second pole piece, the pole pieces being attached to opposite magnetic pole surfaces of the permanent magnet. In a typical magnet according to the invention, the body comprises a first and a second section made of magnetic material and being separated from each other, the first section comprising a cylindrical recess into which the slide is movably arranged so that the cylindrical first pole piece is directed towards the bottom of the cylindrical recess, and a third section connecting the first and the second section, the third section being made of non-magnetic material, wherein at the first position of the slide, the cylindrical first pole piece, the permanent magnet and at least part of the second pole piece are located inside the cylindrical recess, and at the second position of the slide, at least part of the cylindrical first pole piece is located inside the cylindrical recess and the second pole piece is located outside the cylindrical recess.

The magnet according to the invention is an attachment magnet, the magnetic state of which is changed by moving the slide from one position to the other. The magnetic flux is directed to an object to be attached through the first and the second section, which are separated from each other by the third section. The first and the second section are thus magnetically separated and at a distance from each other. At the first position of the slide (OFF state), magnetic flux generated by the permanent magnet is essentially short-circuited by the first section, and therefore the magnet cannot attach to an object or it can attach to an object only very weakly. At the second position of the slide (ON state), magnetic flux can be directed through the first and the second section to an object that is arranged in contact with the first and the second section. The object closes the magnetic circuit and therefore the magnet is attached to the object. The first and the second positions are stable positions, wherein the slide remains until it is acted upon by a force that moves the slide to the other position.

At the first position of the slide, the cylindrical first pole piece, the permanent magnet and at least part of the second pole piece are located inside the cylindrical recess. At the first position of the slide, magnetic flux generated by the permanent magnet is short-circuited by the first section. This means that the magnetic flux flows from one pole piece to the other mainly through a portion of the first section that surrounds the cylindrical recess. At the first position of the slide, the cylindrical first pole piece is preferably in contact with the bottom of the cylindrical recess, so that the magnetic flux is efficiently conducted between the cylindrical first pole piece and the first section. The first position of the slide is a position to which the magnetic force of the permanent magnet actively pulls the slide when the permanent magnet is inside the cylindrical recess. When the slide is moved away from the first position towards the second position, the permanent magnet produces a counterforce that works against the moving force and tries to pull the slide back to the first position. At the first position of the slide, magnetic flux is mainly directed from one pole piece to the first section, and from the first section to the other pole piece in a direction, which is essentially perpendicular to the wall of the cylindrical recess.

At the second position of the slide, at least part of the cylindrical first pole piece is located inside the cylindrical recess and the second pole piece is located outside the cylindrical recess. Preferably, at the second position of the slide, also the permanent magnet is located outside the cylindrical recess. At the second position of the slide, the second pole piece is preferably in contact with the second section, so that the magnetic flux is efficiently conducted between the second pole piece and the second section. Furthermore, the cylindrical first pole piece is preferably in contact with the wall of the cylindrical recess, so that the magnetic flux is efficiently conducted between the cylindrical first pole piece and the first section. At the second position of the slide, magnetic flux is mainly directed between the cylindrical first pole piece and the first section in a direction essentially perpendicular to the wall of the cylindrical recess, and between the second pole piece and the second section in a direction essentially perpendicular to the bottom of the slide. The direction of the magnetic flux to/from the second pole piece is thus turned by about 90 degrees between the first and the second position of the slide.

When the slide is at the second position, magnetic flux generated by the permanent magnet may flow through the first and the second section to an object to be attached. Since the first and the second section are separated from each other by the third section, magnetic flux is prevented from flowing directly between the first and the second section. The object that is arranged in contact with both the first and the second section closes the magnetic circuit, whereby magnetic flux is conducted from one pole piece to the other through the first and the second section and the object.

In the magnet according to the invention the slide is movably arranged in the cylindrical recess. This means that at least part of the slide is always inside the cylindrical recess. The movement of the slide is mechanically supported by the wall of the cylindrical recess. The slide is movable in the longitudinal direction of the cylindrical recess. The slide is arranged to be movable relative to the first and the second section, which are connected together with the third section. The slide is arranged to be linearly movable between the first and the second position. The slide can be designed to be moved between the first and the second position manually, for example with a shaft attached to the slide, or with the help of suitable driving means.

The diameter of the cylindrical recess can be, for example, less than 10 mm, 10-50 mm, 50-200 mm or 200-500 mm. Preferably, the diameter of the cylindrical first pole piece is only slightly smaller than the diameter of the cylindrical recess, whereby the cylindrical recess can support the slide while it is moved between the first and the second position. The diameter of the cylindrical first pole piece can be, for example, less than 2 mm, less than 1 mm, less than 0.5 mm, less than 0.1 mm, less than 0.01 mm or 0.005-0.5 mm smaller than the diameter of the cylindrical recess.

The sections of the body may have various shapes and sizes, and they can be formed of one or more parts. The first and the second section can be, for example, plates, whereby an object to be attached is meant to be in contact with a side of the first plate and a side of the second plate. The sections of the body can be arranged within each other in such a manner that the first section surrounds the third section, which surrounds the second section. The third section can be a sleeve that is arranged around the second section that can be cylindrical. The first and the second section are made of magnetic material that is suitable for conducting magnetic flux. Magnetic material of the first and the second section is ferromagnetic material, such as iron, nickel, cobalt or their alloys. The third section is made of non-magnetic material, which can be paramagnetic material, such as resin, brass or aluminium, or diamagnetic material, such as acid-proof steel or stainless steel.

According to an embodiment of the invention the slide is cylindrical. Preferably, the diameter of the cylindrical slide is only slightly smaller than the diameter of the cylindrical recess, whereby the cylindrical recess can support the cylindrical slide while the slide is moved between the first and the second position. The diameter of the cylindrical slide can be, for example, less than 2 mm, less than 1 mm, less than 0.5 mm, less than 0.1 mm, less than 0.01 mm or 0.005-0.5 mm smaller than the diameter of the cylindrical recess. The length of the slide can be, for example, less than 3 mm, 3-10 mm, 10-100 mm or 100-500 mm. The length of the slide can be larger or smaller than the depth of the cylindrical recess.

The slide has a sandwich structure, wherein the permanent magnet is arranged between the two pole pieces. The pole pieces are attached to different poles of the permanent magnet, and are made of magnetic material so that the magnetic flux generated by the permanent magnet may be conducted through them. Magnetic material of the pole piece is ferromagnetic material, preferably iron. The permanent magnet can be, for example, a neodymium magnet, an alnico magnet or a samarium-cobalt magnet.

According to an embodiment of the invention the second pole piece is cylindrical. Preferably, the pole pieces of the slide have the same diameter. The permanent magnet can be cylindrical and have the same or smaller diameter than the pole pieces. The thickness of the permanent magnet is preferably smaller than the thickness of the pole pieces. The permanent magnet may consist of one or more magnet pieces arranged in one or more layers. The permanent magnet can, for example, be formed of sector pieces arranged in one layer in such a manner that the same poles of the sector pieces are disposed on the same side of the permanent magnet. The number of sector pieces can be, for example, 2, 3, 4-6 or 7-10. The permanent magnet can alternatively be formed of magnet pieces arranged one on the other in such a manner that ferromagnetic discs are arranged between the magnet pieces and the different poles of the magnet pieces are arranged to face each other.

The magnet according to the invention is suitable for moving objects and can thus be used as a lifting magnet. The magnet can be used as follows to move an object from one location to another. First, the magnet is arranged in contact with an object in such a manner that the object is in contact with the attachment surfaces of the first and the second section. Then, the slide is moved to the second position as a result of which the magnet is attached to the object. Next, the object is moved with the magnet to a desired location and the magnet is detached from the object by moving the slide to the first position.

According to an embodiment of the invention the second section comprises a cylindrical recess in line with the cylindrical recess of the first section for receiving at least part of the second pole piece when the slide is at the second position. Preferably, the second pole piece is cylindrical. The depth of the cylindrical recess of the second section is smaller than the depth of the cylindrical recess of the first section.

According to an embodiment of the invention the slide comprises grooves extending in the longitudinal direction of the slide.

According to an embodiment of the invention the wall of the cylindrical recess is defined by a tubular portion of the first section. The tubular portion can be, for example, a hollow tube.

According to an embodiment of the invention the first and the second section are plates arranged in parallel to each other. The slide is arranged to move in a direction perpendicular to the plane of the plates. The shape of the first and the second plate can be optimised in such a manner that the leakage flux between the plates is small or the attachment surface is large. Preferably, the first and the second plate are rectangular. The thickness of the first and the second plate can be, for example, less than 3 mm, 3-10 mm, 10-100 mm or 100-500 mm. A side of the first and the second plate that is meant to be in contact with an object can be straight, curved or bevelled. Preferably, a side of the first and the second plate that is meant to be in contact with an object is shaped to correspond to the shape of the object.

According to an embodiment of the invention the third section comprises a plurality of connecting members attached between the first and the second section. The number of the connecting members can vary depending on the application. In a case where the first and the second section are plates, a connecting member is preferably attached to each corner of the first and the second plate, whereby if the first and the second plate are rectangular, the body comprises four connecting members. Preferably, the connecting members are rods or bars, whose first ends are attached to the first section, and whose second ends are attached to the second section. The connecting members can be made of paramagnetic material, such as resin, brass or aluminium, or diamagnetic material, such as acid-proof steel or stainless steel.

According to an embodiment of the invention the cylindrical recess opens into a cavity defined by the first, the second and the third section. The cavity can be, for example, cylindrical. The third section can comprise a cylindrical through hole that defines the wall of the cylindrical cavity. The first and the second section that close the cylindrical through hole of the third section define the ends of the cylindrical cavity.

According to an embodiment of the invention the cylindrical recess and the cavity contain a medium, and the magnet comprises means for transferring the medium into and out of the cylindrical recess and the cavity in order to move the slide. The slide is moved relative to the body by transferring medium into and out of an airtight space formed by the cavity and the cylindrical recess. When medium is transferred into the cylindrical recess and out of the cavity the slide moves towards the second position. When medium is transferred into the cavity and out of the cylindrical recess the slide moves towards the first position. The cylindrical recess and the cavity can be connected together through the means for transferring the medium, whereby medium can be transferred from the cylindrical recess to the cavity, and vice versa. Alternatively, the means for transferring the medium can be arranged to separately control the medium in the cylindrical recess and the cavity. In this case, the means for transferring the medium can comprise containers for both the cylindrical recess and the cavity for receiving the medium that has been transferred out of the cylindrical recess or the cavity.

The holding force of the magnet, in which the slide is moved using a medium, can be adjusted steplessly. The holding force of the magnet can be set at a desired value by positioning the slide at a suitable position. The holding force can be increased by moving the slide towards the second position. The holding force can be decreased by moving the slide towards the first position.

According to an embodiment of the invention the means for transferring the medium into and out of the cylindrical recess and the cavity comprises a first and a second conduit integrated into the body, a first end of the first conduit being in communication with the cylindrical recess and a first end of the second conduit being in communication with the cavity. Medium can be transferred into and out of the cylindrical recess and the cavity through the first and the second conduit, respectively. Preferably, the first end of the first conduit is arranged in communication with the cylindrical recess through the portion of the first section that defines the bottom of the cylindrical recess, and the first end of the second conduit is arranged in communication with the cavity through the portion of the second section that is in contact with the slide when the slide is at the second position. Second ends of the conduits may be in communication with each other so that the medium that has been transferred out of the cylindrical recess can be transferred into the cavity, and vice versa. The magnet may comprise a plurality of first and second conduits. The number of the first and the second conduits can be, for example, 2-4, 5-10 or 10-30.

According to an embodiment of the invention a second end of the first conduit and a second end of the second conduit open outside the magnet. The first and the second conduit thus extend through the body.

According to an embodiment of the invention the medium is gas, and the means for transferring the medium into and out of the cylindrical recess and the cavity comprises a pneumatic system coupled to the second end of the first and the second conduit.

According to an embodiment of the invention the medium is liquid, and the means for transferring the medium into and out of the cylindrical recess and the cavity comprises a hydraulic system coupled to the second end of the first and the second conduit.

According to an embodiment of the invention the means for transferring the medium into and out of the cylindrical recess and the cavity comprises a pump coupled to the second end of the first and the second conduit. The pump is configured to transfer medium in two directions, whereby the medium can be transferred from the cylindrical recess into the cavity, and vice versa. Depending on the type of the medium, the pump can be a hydraulic pump or a pneumatic pump, such as a piston pump, a screw pump or a gear pump. It is also possible to use an existing hydraulic or pneumatic system coupled to the second ends of the conduits for transferring the medium into and out of the cylindrical recess and the cavity.

According to an embodiment of the invention the means for transferring the medium into and out of the cylindrical recess and the cavity comprises a first pipe coupled between the pump and the second end of the first conduit, and a second pipe coupled between the pump and the second end of the second conduit.

According to an embodiment of the invention the medium is gas or liquid. A suitable gas for the magnet is, for example, air. Suitable liquids for the magnet are, for example, oil and water. Preferably, the liquid that is used also functions as a lubricant, reducing the friction between the slide and the cylindrical recess.

According to an embodiment of the invention the magnet comprises a sealing ring attached around the cylindrical first pole piece. The cylindrical first pole piece preferably comprises a groove in which the sealing ring is installed. The sealing ring divides the airtight space formed by the cylindrical recess and the cavity into two portions and prevents the medium from flowing between said portions. The sealing ring makes it easier to create a sufficient pressure difference and enables moving the slide efficiently. The sealing ring can be made of, for example, silicone, ethylene-propylene, polyurethane, nitrile-butadiene rubber or acetal plastics, or their compounds.

According to an embodiment of the invention the slide comprises a cap attached on top of the cylindrical first pole piece for holding the sealing ring in place. The cap may comprise a groove in which the sealing ring is installed. The groove is preferably arranged near the end of the cap that is attached to the cylindrical first pole piece. The groove may be located between the cap and the cylindrical first pole piece. The cap can be made of magnetic or non-magnetic material.

According to an embodiment of the invention the magnet comprises a sealing ring attached to the wall of the cylindrical recess.

According to an embodiment of the invention the magnet comprises a coil attached to the body and configured to generate a magnetic force for moving the slide towards the first or the second position depending on the direction of electric current that is supplied to the coil. Preferably, the coil is arranged in such a manner that it at least partly encircles the slide. Although the coil is primarily used for moving the slide between the first and the second position, it may also be used to adjust the holding force of the magnet. When the slide is at the second position, the holding force of the magnet can be increased or decreased by supplying electric current to the coil in a suitable direction.

According to an embodiment of the invention the magnet comprises means for supplying electric current to the coil. The means for supplying electric current may comprise, for example, a battery that is connected to the coil via a control unit. The control unit is configured to control the amount and the direction of electric current supplied to the coil. The control unit may comprise one or more operating switches for using the magnet, and/or a wireless receiver for receiving control commands from a remote controller. The control unit may also comprise one or more indicator lights for indicating the status of the magnet, and/or a wireless transmitter for transmitting the status information to the remote controller.

The state of the magnet, i.e. the position of the slide, can be changed with an electric current pulse that has a certain duration, magnitude and polarity. The duration and the magnitude of the electric current pulse that is needed to change the state of the magnet are highly dependent of the structure and the size of the magnet, and the magnetic properties of the object to be attached. The polarity of the electric current pulse depends on the direction to which the slide needs to be moved. Typically, the duration of the electric current pulse is 30-300 ms.

According to an embodiment of the invention the slide comprises a guiding rod extending from the second pole piece to a bore in the second section. The guiding rod, which extends in the longitudinal direction of the cylindrical recess, may be arranged to extend partly or completely through the slide. The guiding rod is preferably dimensioned in such a manner that at least part of the guiding rod stays in the bore all the time. The purpose of the guiding rod is to reduce the movement of the slide in other directions than the longitudinal direction of the cylindrical recess. The guiding rod is made of non-magnetic material, which can be paramagnetic material, such as resin, brass or aluminium, or diamagnetic material, such as acid-proof steel or stainless steel.

According to an embodiment of the invention the magnet comprises a magnetic flux sensor configured to measure magnetic flux density in the body and means for determining the position of the slide based on the measured magnetic flux density. By a magnetic flux sensor it is meant a transducer that varies its output voltage and/or current in response to magnetic flux density. The magnetic flux sensor can be attached to the first or the second section. Since the path of the magnetic flux in the first and the second section is dependent on the position of the slide, the position of the slide can be determined from the output voltage and/or current of the magnetic flux sensor. The means for determining the position of the slide may comprise, for example, a comparator circuit for providing, as a response to the output voltage and/or current of the magnetic flux sensor, an output signal identifying at which position the slide is. The magnetic flux sensor may also be configured to indicate the position of the slide directly as a binary output. The magnetic flux sensor may also be used to detect whether an object is attached to the magnet or not.

The magnetic flux sensor can be arranged inside the first or the second section, or attached on their surface. If the magnetic flux sensor is arranged to the first section, it is preferably arranged inside the portion of the section that surrounds the cylindrical recess.

The magnet may comprise a plurality of magnetic flux sensors configured to measure magnetic flux densities in different spatial locations and/or directions. The number of magnetic flux sensors can be, for example, 2, 3, or more than 3. Preferably, the magnetic flux sensors are configured to measure magnetic flux densities in orthogonal directions.

According to an embodiment of the invention the magnetic flux sensor is one of the following: a Hall sensor, an AMR magnetometer, a MEMS sensor or a reed relay.

An advantage of the magnet according to the invention is that the magnet does not consume energy when the slide is at either of its two positions. Also the magnet does not have any complex structure for keeping the slide at either of its two positions. In fact, the slide stays in place at both of its two positions with the help of the magnetic field produced by the permanent magnet. Another advantage of the magnet is that its magnetic state can be changed easily. Still another advantage of the magnet is its simple structure that makes the magnet very robust and reliable. Still another advantage of the magnet is that it provides a large holding force with a small size.

Still another advantage of the magnet is that the demagnetization of the permanent magnet can be greatly reduced because the magnetic circuit is closed at the first position of the slide. Still another advantage of the magnet is that its holding force is minimal when the magnet is in the OFF state.

The exemplary embodiments of the invention presented in this text are not interpreted to pose limitations to the applicability of the appended claims. The verb "to comprise" is used in this text as an open limitation that does not exclude the existence of also unrecited features. The features recited in the dependent claims are mutually freely combinable unless otherwise explicitly stated.

DETAILED DESCRIPTION OF THE DRAWINGS

The same reference signs are used of the same or like components in different embodiments.

Figure 1A:
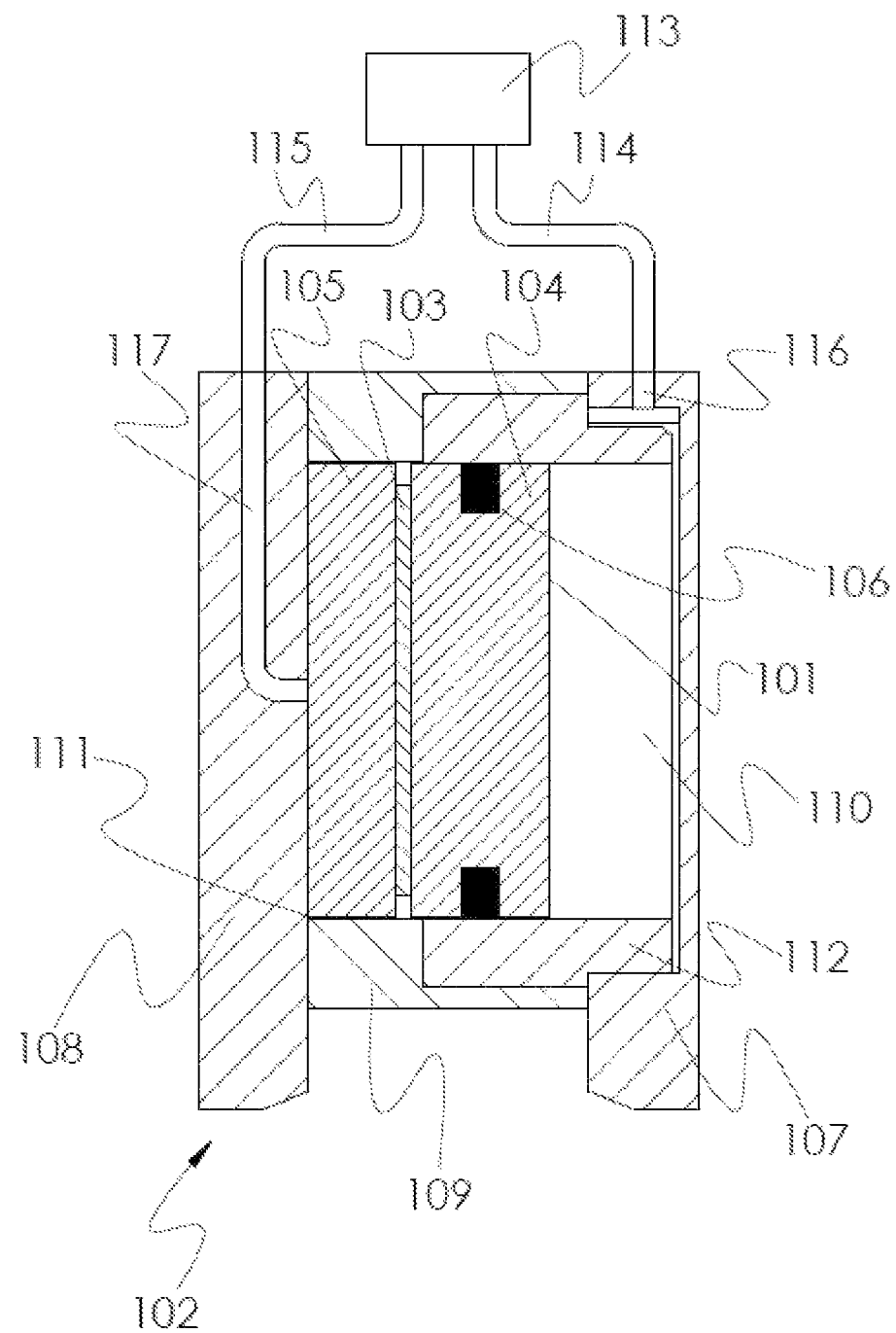
FIGS. 1a-1b illustrate cross-sectional views of a magnet according to a first embodiment of the invention.
Figure 1B:
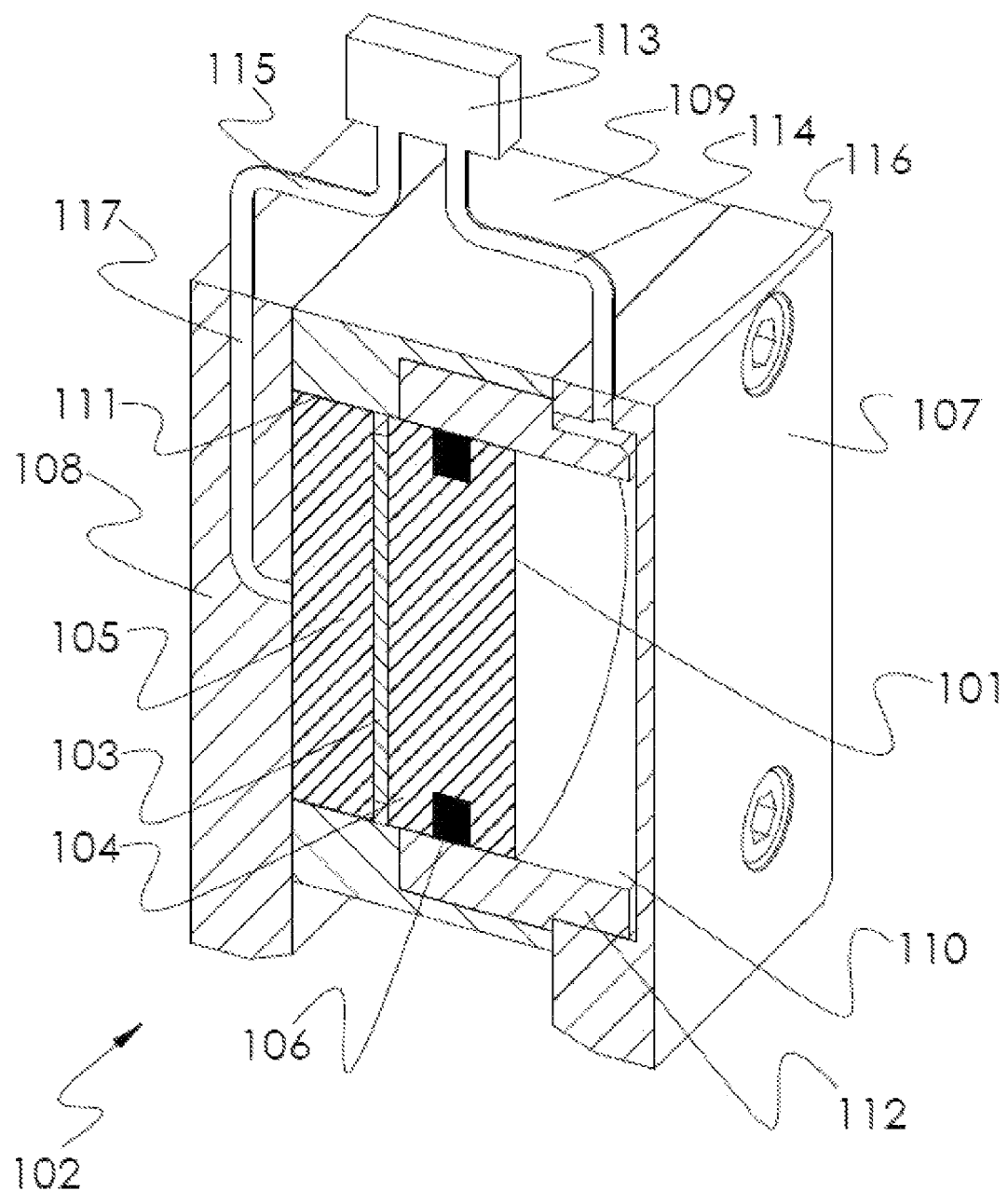

FIGS. 1a and 1b illustrate cross-sectional views of a magnet according to a first embodiment of the invention. The magnet comprises a slide 101 that is arranged to be movable relative to a body 102 between a first and a second position. The magnet is in an OFF state, when the slide 101 is at the first position, and in an ON state, when the slide 101 is at the second position. FIGS. 1a and 1b show the magnet in the ON state.

The slide 101 is cylindrical and comprises a permanent magnet 103, and a first and a second pole piece 104, 105, which are attached to opposite magnetic pole surfaces of the permanent magnet 103. The slide 101 also comprises a sealing ring 106 that is attached around the first pole piece 104. The body 102 comprises a first and a second section 107, 108, which are made of magnetic material and attached to a third section 109 that is made of non-magnetic material. The first and the second section 107, 108 are rectangular plates. An object to be attached (not shown in FIGS. 1a and 1b) is meant to be in contact with sides of the first and the second section 107, 108.

The first section 107 comprises a cylindrical recess 110 that opens into a cavity 111 defined by the first, the second and the third section 107, 108, 109. The wall of the cylindrical recess 110 is defined by a tubular portion 112 of the first section 107. The slide 101 is movably arranged into the cylindrical recess 110 so that the first pole piece 104 is directed towards the bottom of the cylindrical recess 110. The sealing ring 106 is attached to the first pole piece 104 in such a position that the sealing ring 106 stays inside the cylindrical recess 110. When the slide 101 is at the first position, the first pole piece 104, the permanent magnet 103 and the second pole piece 105 are located inside the cylindrical recess 110. When the slide 101 is at the second position, part of the first pole piece 104 is located inside the cylindrical recess 110, and the permanent magnet 103 and the second pole piece 105 are located outside the cylindrical recess 110.

The slide 101 is moved relative to the body 102 by conveying air into and out of an airtight space that is formed by the cavity 111 and the cylindrical recess 110. When air is supplied into the cylindrical recess 110 and exhausted from the cavity 111, the slide 101 moves towards the second position. When air is supplied into the cavity 111 and exhausted from the cylindrical recess 110, the slide 101 moves towards the first position.

The air is conveyed into and out of the cylindrical recess 110 and the cavity 111 using a pneumatic system 113 that is coupled via a first and a second pipe 114, 115 to a first and a second conduit 116, 117 that are integrated into the body 102. The first end of the first conduit 116 is arranged in communication with the cylindrical recess 110 through the portion of the first section 107 that defines the bottom of the cylindrical recess 110. The first end of the second conduit 117 is arranged in communication with the cavity 111 through the portion of the second section 108 that is in contact with the slide 101, when the slide 101 is at the second position.

Figure 2:
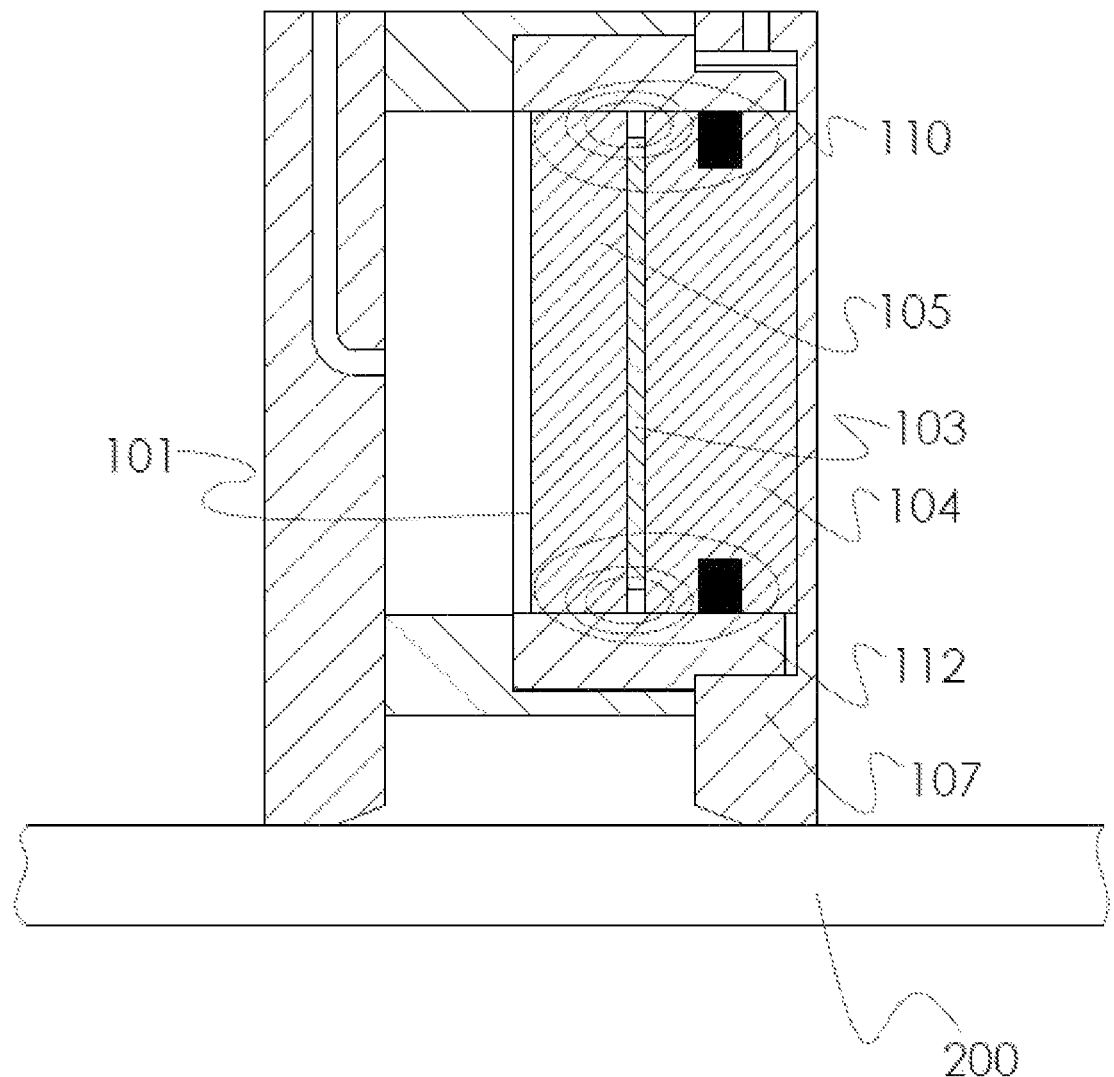
FIG. 2 illustrates the magnetic field generated by the magnet of FIGS. 1a and 1b, when the slide is at the first position.

FIG. 2 illustrates the magnetic field generated by the magnet of FIGS. 1a and 1b, when the slide 101 is at the first position. The magnetic field is represented by magnetic field lines. At the first position of the slide 101, the first pole piece 104, the permanent magnet 103 and the second pole piece 105 are located inside the cylindrical recess 110, as a result of which the magnetic flux generated by the permanent magnet 103 flows from one pole piece to the other mainly through the tubular portion 112 of the first section 107. At the first position of the slide 101, the first pole piece 104 is in contact with the bottom of the cylindrical recess 110. Because the magnetic flux generated by the permanent magnet 103 is short-circuited by the first section 107, the holding force of the magnet is negligible, and therefore the magnet cannot attach to an object 200.

Figure 3:
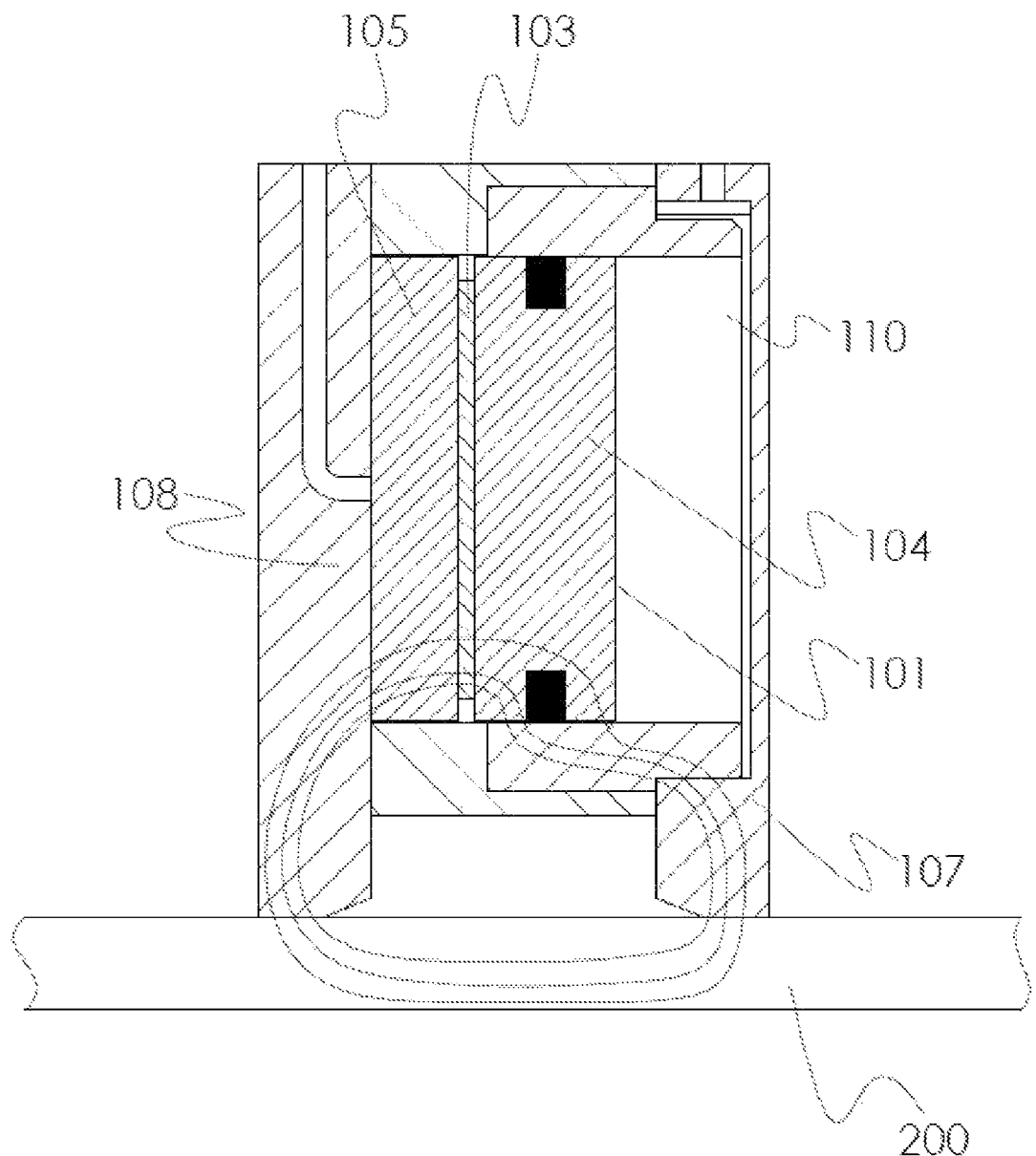
FIG. 3 illustrates the magnetic field generated by the magnet of FIGS. 1a and 1b, when the slide is at the second position.

FIG. 3 illustrates the magnetic field generated by the magnet of FIGS. 1a and 1b, when the slide 101 is at the second position. The magnetic field is represented by magnetic field lines. At the second position of the slide 101, part of the first pole piece 104 is located inside the cylindrical recess 110, and the permanent magnet 103 and the second pole piece 105 are located outside the cylindrical recess 110. The second pole piece 105 is in contact with the second section 108, so that the magnetic flux is efficiently conducted between the second pole piece 105 and the second section 108. The object 200 that is arranged in contact with both the first and the second section 107, 108 closes the magnetic circuit, whereby magnetic flux is conducted from one pole piece to the other through the first and the second section 107, 108 and the object 200. The magnet is thus attached to the object 200.

Figure 4A:
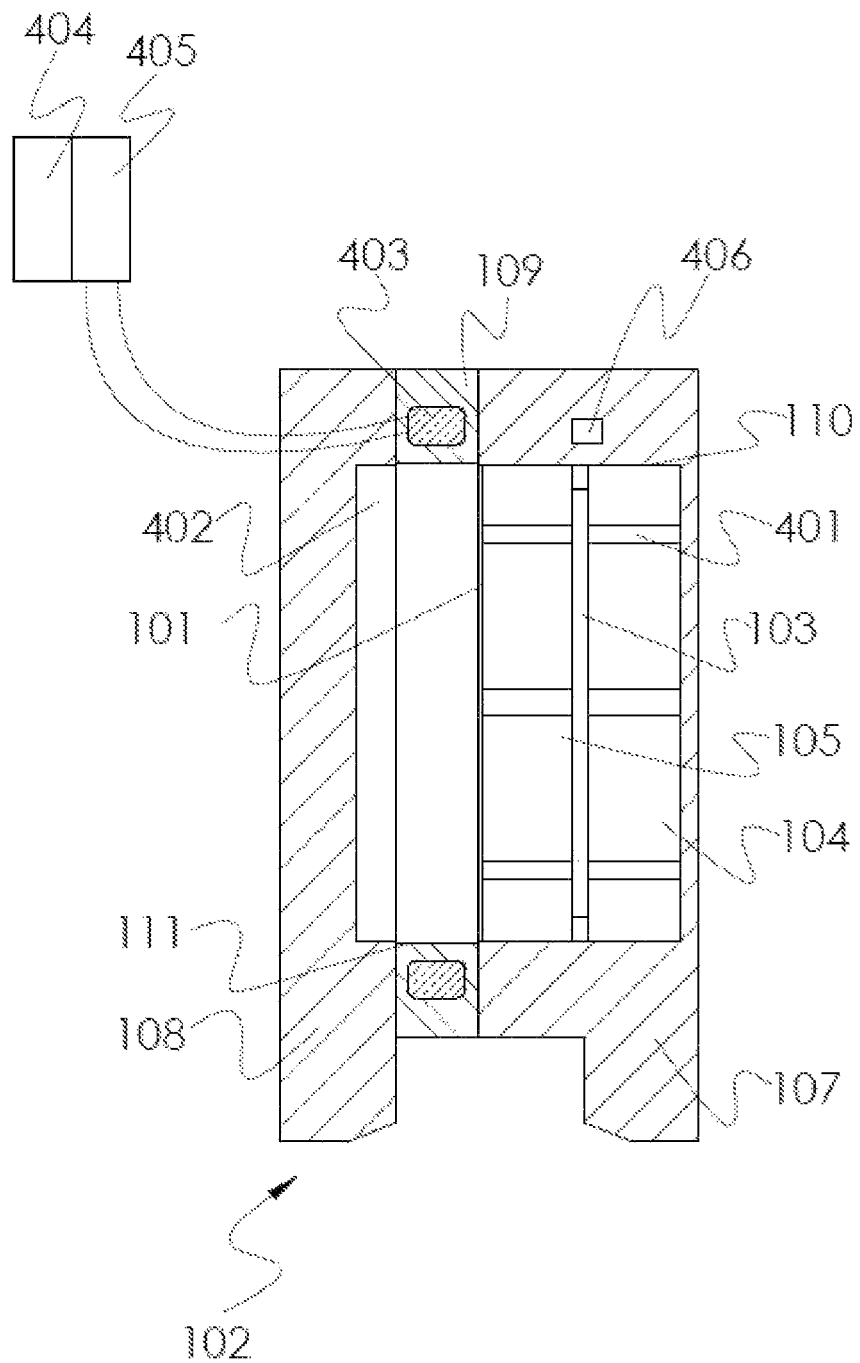
FIGS. 4a-4b illustrate cross-sectional views of a magnet according to a second embodiment of the invention.
Figure 4B:
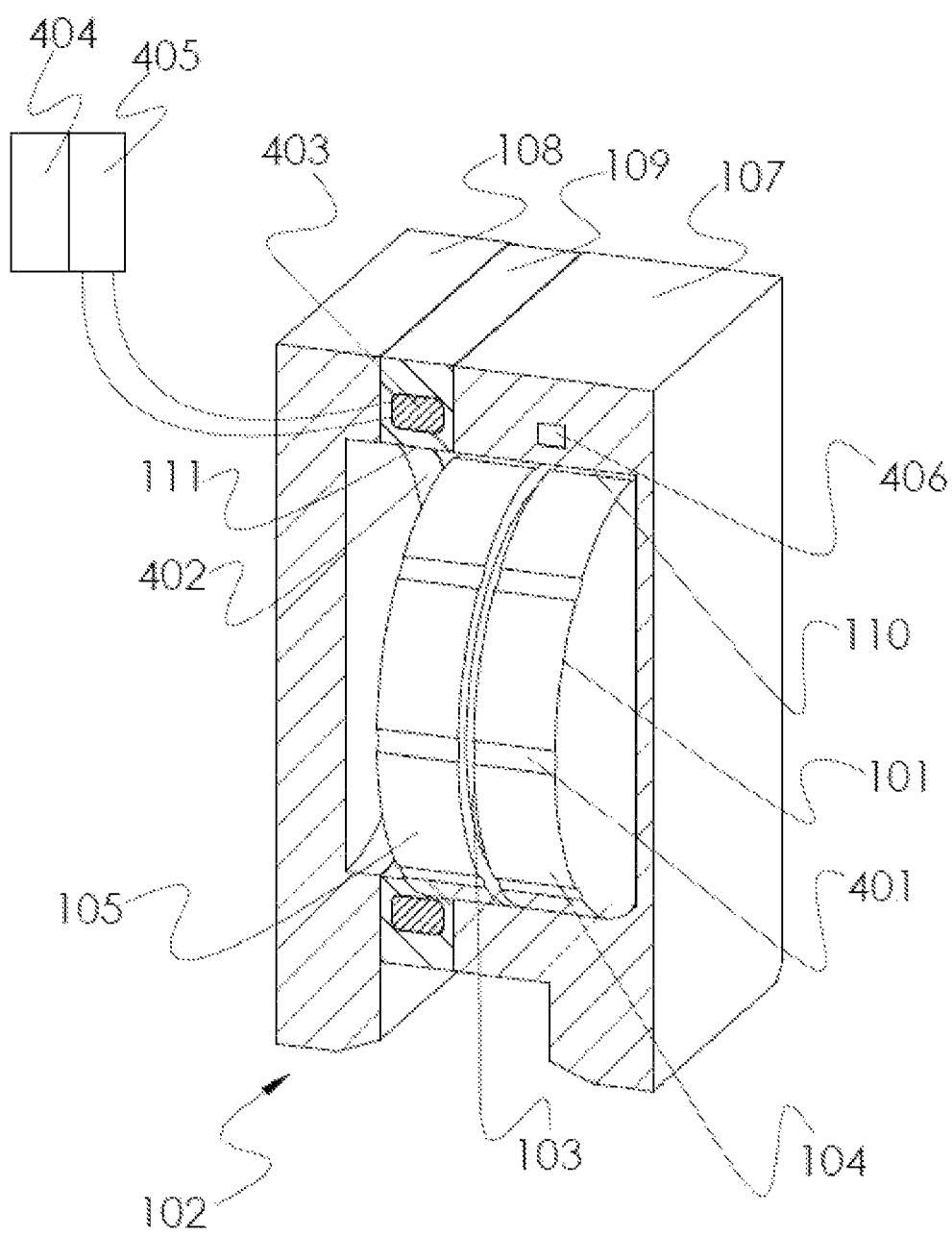

FIGS. 4a and 4b illustrate cross-sectional views of a magnet according to a second embodiment of the invention. The magnet comprises a slide 101 that is arranged to be movable relative to a body 102 between a first and a second position. The slide 101 is cylindrical and comprises a permanent magnet 103, and a first and a second pole piece 104, 105, which are attached to opposite magnetic pole surfaces of the permanent magnet 103. The slide 101 also comprises grooves 401 that extend in the longitudinal direction of the slide 101. The body 102 comprises a first and a second section 107, 108, which are made of magnetic material and attached to a third section 109 that is made of non-magnetic material. The first and the second section 107, 108 are rectangular plates.

Both the first section 107 and the second section 108 comprise a cylindrical recess 110, 402 that opens into a cavity 111 defined by the first, the second and the third section 107, 108, 109. The cylindrical recesses 110, 402 are bored to the first and the second section 107, 108, respectively. The slide 101 is movably arranged into the cylindrical recess 110 of the first section 107, so that at the first position of the slide 101, the first pole piece 104, the permanent magnet 103 and the second pole piece 105 are located inside the cylindrical recess 110, and at the second position of the slide 101, part of the first pole piece 104 is located inside the cylindrical recess 110, and the permanent magnet 103 and the second pole piece 105 are located outside the cylindrical recess 110. At the second position of the slide 101, part of the second pole piece 105 is located inside the cylindrical recess 402 of the second section 108.

The magnet comprises a coil 403 that is attached to the third section 109. The coil 403 is configured to generate a magnetic force for moving the slide 101 towards the first or the second position depending on the direction of electric current that is supplied to the coil 403. The magnet comprises a battery 404 that is connected via a control unit 405 to the coil 403. The control unit 405 controls the amount and the direction of electric current supplied from the battery 404 to the coil 403. The state of the magnet, i.e. the position of the slide 101, is changed with an electric current pulse that has a certain duration, magnitude and polarity. The position of the slide 101 is determined with a magnetic flux sensor 406 that is arranged inside the first section 107, close to the cylindrical recess 110.

Only advantageous exemplary embodiments of the invention are described in the figures. It is clear to a person skilled in the art that the invention is not restricted only to the examples presented above, but the invention may vary within the limits of the claims presented hereafter. Some possible embodiments of the invention are described in the dependent claims, and they are not to be considered to restrict the scope of protection of the invention as such.

The invention claimed is:

1. A magnet, comprising:
   a body, comprising a first, a second and a third section, the first and the second section being made of magnetic material and being separated from each other, the first section comprising a cylindrical recess, and the third section connecting the first and the second section, and being made of non-magnetic material, and
   a slide comprising a permanent magnet, a cylindrical first pole piece and a second pole piece, the pole pieces being attached to opposite magnetic pole surfaces of the permanent magnet, and the slide being movably arranged into the cylindrical recess so that the cylindrical first pole piece is directed towards the bottom of the cylindrical recess and the slide being movable relative to the body between a first and a second position;
   wherein at the first position of the slide, the cylindrical first pole piece, the permanent magnet and at least part of the second pole piece are located inside the cylindrical recess, and at the second position of the slide, at least part of the cylindrical first pole piece is located inside the cylindrical recess and the second pole piece is located outside the cylindrical recess.

2. The magnet according to claim 1, wherein at the first position of the slide, the cylindrical first pole piece is in contact with the bottom of the cylindrical recess.

3. The magnet according to claim 1, wherein at the second position of the slide, the second pole piece is in contact with the second section.

4. The magnet according to claim 1, wherein the slide comprises grooves extending in the longitudinal direction of the slide.

5. The magnet according to claim 1, wherein the wall of the cylindrical recess is defined by a tubular portion of the first section.

6. The magnet according to claim 1, wherein the first and the second section are plates arranged in parallel to each other.

7. The magnet according to claim 1, wherein the cylindrical recess opens into a cavity defined by the first, the second and the third section.

8. The magnet according to claim 7, wherein:
   the cylindrical recess and the cavity contain a medium, and
   the magnet comprises means for transferring the medium into and out of the cylindrical recess and the cavity in order to move the slide.

9. The magnet according to claim 8, wherein the means for transferring the medium into and out of the cylindrical recess and the cavity comprises a first and a second conduit integrated into the body, a first end of the first conduit being in communication with the cylindrical recess and a first end of the second conduit being in communication with the cavity.

10. The magnet according to claim 9, wherein a second end of the first conduit and a second end of the second conduit open outside the magnet.

11. The magnet according to claim 9, wherein the medium is gas, and the means for transferring the medium into and out of the cylindrical recess and the cavity comprises a pneumatic system coupled to the second end of the first and the second conduit.

12. The magnet according to claim 9, wherein the medium is liquid, and the means for transferring the medium into and out of the cylindrical recess and the cavity comprises a hydraulic system coupled to the second end of the first and the second conduit.

13. The magnet according to claim 1, wherein the magnet comprises a sealing ring attached around the cylindrical first pole piece.

14. The magnet according to claim 1, wherein the magnet comprises a coil attached to the body and configured to generate a magnetic force for moving the slide towards the first or the second position depending on the direction of electric current that is supplied to the coil.

15. The magnet according to claim 1, wherein the magnet comprises:
   a magnetic flux sensor configured to measure magnetic flux density in the body, and
   means for determining the position of the slide based on the measured magnetic flux density.

16. The magnet according to claim 15, wherein the magnetic flux sensor is one of the following: a Hall sensor, an AMR magnetometer, a MEMS sensor or a reed relay.

* * * * *